(12) United States Patent
Shaw

(10) Patent No.: US 11,824,052 B2
(45) Date of Patent: Nov. 21, 2023

(54) ELECTRO-OPTICAL SYSTEM WITH AN ELECTRICAL INTEGRATED CIRCUIT OVER AN OPTICAL INTEGRATED CIRCUIT

(71) Applicant: STMicroelectronics S.r.l., Agrate Brianza (IT)

(72) Inventor: Mark Andrew Shaw, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 183 days.

(21) Appl. No.: 17/342,730

(22) Filed: Jun. 9, 2021

(65) Prior Publication Data
US 2021/0296297 A1 Sep. 23, 2021

Related U.S. Application Data

(62) Division of application No. 16/404,174, filed on May 6, 2019, now Pat. No. 11,063,029.

(30) Foreign Application Priority Data

May 7, 2018 (IT) .......................... 102018000005106

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/19* (2013.01); *H01L 24/20* (2013.01); *H01L 25/165* (2013.01);
(Continued)

(58) Field of Classification Search
CPC ......... H01L 27/14618; H01L 27/14625; H01L 25/167; H01L 2221/68372; H01L 2221/6834; H01L 21/6835; H01L 25/165; H01L 31/0203; H01L 31/02164; H01L 31/167; H01L 31/173; H01L 31/02005; H01L 31/18; H01L 24/03; H01L 24/05;
(Continued)

(56) References Cited

U.S. PATENT DOCUMENTS 3,436,810 A 4/1969 Kauffman et al.
5,216,278 A 6/1993 Lin et al.
(Continued)

FOREIGN PATENT DOCUMENTS

EP 2448001 A2 5/2012

OTHER PUBLICATIONS

Bazzotti, Adamo et al., "Silicon Photonics Assembly Industrialisation," European Microelectronics Packaging Conference, Sep. 2015, Friedrichshafen, Germany, 6 pages.
(Continued)

*Primary Examiner* — Nelson Garces
(74) *Attorney, Agent, or Firm* — Slater Matsil, LLP

(57) ABSTRACT

An optoelectronic device includes an optical integrated circuit having a first surface and a second surface opposite the first surface. The optical integrated circuit has an optical zone of the first surface of the optical integrated circuit. The device includes an electrically insulating material disposed over the optical integrated circuit, where the electrically insulating material partially covers the first surface so as to expose the optical zone.

18 Claims, 9 Drawing Sheets

(51) Int. Cl.
  *H01L 31/02* (2006.01)
  *H01L 31/0203* (2014.01)
  *H01L 31/18* (2006.01)
(52) U.S. Cl.
  CPC .... *H01L 31/0203* (2013.01); *H01L 31/02005* (2013.01); *H01L 31/18* (2013.01); *H01L 2224/214* (2013.01)
(58) Field of Classification Search
  CPC ......... H01L 24/06; H01L 24/11; H01L 24/13; H01L 24/16; H01L 24/17; H01L 24/19; H01L 24/20; H01L 24/32; H01L 24/81; H01L 24/83; H01L 24/92; H01L 24/96; H01L 2224/214; H01L 2224/03334; H01L 2224/03003; H01L 2224/0391; H01L 2224/0508; H01L 2224/051; H01L 2224/05147; H01L 2224/05155; H01L 2224/056; H01L 2224/0603; H01L 2224/0612; H01L 2224/06181; H01L 2224/12105; H01L 2224/17051; H01L 2224/17181; H01L 2224/16145; H01L 2224/16227; H01L 2224/16235; H01L 2224/32145; H01L 2224/32225; H01L 2224/73204; H01L 2224/81002; H01L 2224/81005; H01L 2224/81193; H01L 2224/83002; H01L 2224/83005; H01L 2224/83104; H01L 2224/9205; H01L 2224/92125; H01L 2224/92222; H01L 2224/92242; H01L 2224/96; H01L 2924/12043; H01L 2924/14; H01L 2924/1424; H01L 2924/1426; G01S 7/4813; G01S 17/04; G02B 6/4255
  See application file for complete search history.

(56) References Cited

U.S. PATENT DOCUMENTS

| | | | |
|---|---|---|---|
| 6,287,893 | B1 | 9/2001 | Elenius et al. |
| 6,727,576 | B2 | 4/2004 | Hedler et al. |
| 9,000,584 | B2 | 4/2015 | Lin et al. |
| 9,057,853 | B2 | 6/2015 | Lau et al. |
| 10,055,296 | B2 | 8/2018 | Su |
| 10,586,048 | B2 | 3/2020 | Lu et al. |
| 2003/0234452 | A1 | 12/2003 | Tao et al. |
| 2009/0086449 | A1 | 4/2009 | Minamio et al. |
| 2009/0224386 | A1 | 9/2009 | Camacho et al. |
| 2012/0104454 | A1 | 5/2012 | Coffy |
| 2012/0248625 | A1* | 10/2012 | Coffy .................. H01L 31/167 257/E23.145 |
| 2013/0161833 | A1 | 6/2013 | Pendse |
| 2013/0320471 | A1 | 12/2013 | Luan |
| 2014/0070380 | A1 | 3/2014 | Chiu et al. |
| 2014/0252655 | A1 | 9/2014 | Tran et al. |
| 2015/0255500 | A1 | 9/2015 | Akahoshi et al. |
| 2016/0216445 | A1 | 7/2016 | Thacker et al. |
| 2018/0045885 | A1 | 2/2018 | Canali et al. |
| 2019/0146166 | A1* | 5/2019 | Wang .................. G02B 6/428 385/14 |
| 2020/0310052 | A1* | 10/2020 | Lim .................. H01L 21/56 |

OTHER PUBLICATIONS

Boeuf, Frederic et al., "Silicon Photonics R&D and Manufacturing on 300-mm Wafer Platform," Journal of Lightwave Technology, vol. 34, No. 2, Jan. 15, 2016, 10 pages.
Chen, Nan-Cheng et al., "A Novel System in Package with Fan-out WLP for high speed SERDES application", IEEE 66th Electronic Components and Technology Conference, May 31-Jun. 2016, 7 pages.
Deo, Manish, "Enabling Next-Generation Platforms Using Intel's 3D System-in-Package Technology", Intel White Paper, FPGA, Dec. 19, 2018, 7 pages.
Hayakawa, Akinori, et al., "Silicon Photonics Optical Transceiver for High-Speed, High-Density and Low-Power LSI Interconnect," Fujitsu Science Technology J., vol. 52, No. 1, Jan. 2016, 20 pages.
Huemoeller, Ron, "Amko's Slim & Swift Package Technology," Amkor Technology, SVP Advanced Package Technology Develop & IP, May 2015, 19 pages.
Kim, Yonghoon et al., "Samung Fan-Out Panel Level Package Solutions", IEEE Electron Devices Technology and Manufacturing Conference (EDTM), Mar. 12-15, 2019, 3 pages.
Kim, YoungRae et al., "SLIMtm, High Density Wafer Level Fan-out Package Development with Submicron Rdl", IEEE 57th Electronic Components and Technology Conference, May 30-Jun. 2017, 6 pages.
Lau, John H., "Patent Issues of Embedded Fan-Out Wafer/Panel Level Packaging", IEEE China Semiconductor Technology International Conference (CSTIC), Mar. 13-14, 2016, 7 pages.
Lau, J., et al., "Redistribution Layers (RDLs) for 2.5D/3D IC Integration", ResearchGate, International Symposium on Microelectronics, Jan. 2013, Journal of Microelectronics and Electronic Packaging, 11, 2014, ISSN: 1551-4897, pp. 16-24.
Lau, John H., "Recent Advances and New Trends in Flip Chip Technology", ASME Digital Collection, Journal of Electronic Packaging, vol. 138, Issue 3, Jul. 25, 2016, 23 pages.
Lau, et al., "3D Chip Stacking Applications in High Volume Manufacturing", Chip Scale Review, The Future of Semiconductor Packaging, vol. 20, No. 3, May-Jun. 2016, 68 pages.
Lin, Yuan-Ting et al., "Wafer Warpage Experiments and Simulation for Fan-Out Chip on Subsrate (FOCos)", IEEE 66th Electronic Components and Technology Conference, May 31-Jun. 3, 2016, 6 pages.
Narasimha, Adithyaram et al., "An Ultra Low Power CMOS Photonics Technology Platform for H/S Optoelectronic Transceivers at less than $1 per Gbps," 2010 Conference on Optical Fiber Communication (OFC/NFOEC), collocated National Fiber Optic Engineers Conference. IEEE, 2010, 3 pages.
Schneider Electric, UPS Network Management Card 2—User's Guide, 88 pages (Year: 2014).
Tzeng, Pei-Jer et al., "Process Integration of 3D Si Interposer with Double-Sided Active Chip Attachments", IEEE Electronic Components & Technology Conference, May 28-31, 2013, 8 pages.
Zewenger, Curtis et al., "Electrical and Thermal Simulation of SWIFT High-density Fan-out PoP Technology," May 2017 IEEE 67th Electronic Components and Technology Conference, 6 pages.

* cited by examiner

ELECTRO-OPTICAL SYSTEM WITH AN ELECTRICAL INTEGRATED CIRCUIT OVER AN OPTICAL INTEGRATED CIRCUIT

CROSS-REFERENCE TO RELATED APPLICATIONS

This application is a divisional application of U.S. application Ser. No. 16/404,174, filed on May 6, 2019, which claims the benefit of Italian Patent Application No. 102018000005106, filed on May 7, 2018, which applications are hereby incorporated herein by reference.

TECHNICAL FIELD

The present invention relates generally to a device, and, in particular embodiments, to a device, corresponding method and electro-optical system.

BACKGROUND

Fan-Out Wafer Level Packaging (FOWLP) technology may be an example of known packaging, developed to provide a solution for semiconductor devices requiring a higher integration level and a greater number of external contacts.

Such technology may provide a smaller package footprint featuring a high number of input/output (I/O) terminals along with improved thermal and electrical performances. In conventional Wafer Level Packaging WLP schemes, I/O terminals may be located over the chip surface area, and a limitation is therefore present in the number of I/O connections.

Conversely, Fan-Out WLP (FOWLP) may use individual semiconductor dies and embed such dies in a low cost material, such as epoxy mold compound (EMC) having a space between each die allocated for additional I/O connection points—avoiding the use of relatively expensive Si real estate to accommodate a high I/O count. Redistribution Layers (RDL) may be also employed, e.g., formed using PVD Physical Vapor (seed) Deposition, and subsequent electroplating/patterning thereof to re-route I/O connections on the die to the mold compound regions in the periphery.

Standard package assembly flows of semiconductor devices may be available, e.g. from Amkor Technologies, 2045, East Innovation Circle, Tempe, AZ 85284, USA. Such exemplary standard processes may comprise a SLIM (Silicon-Less Integrated Module) and SWIFT (Silicon Wafer Integrated Fan-out Technology) assembly flows. Other examples include embedded wafer level ball grid arrays eWLB available e.g. from Infineon Technologies AG, Am Campeon 1-12, 85579, Neubiberg, Germany.

Documents such as: US 3,436,810 A, US 5,216,278 A, US 6,287,893 B1, US 6,727,576 B2, US 9,000,584 B2, US 9,057,853 B2, US 2013/0161833 A1, US 2014/0070380 A1 are exemplary of known assembly processes.

Silicon Photonics devices are often constructed using two separate silicon chips, wherein one chip comprises predominantly optical functions (e.g. waveguides, photodiodes, optical modulators, etc.) and another chip comprises electrical functions (e.g. amplifiers, modulator drivers, etc.).

A solution related to silicon photonics chips that may be of some interest for the present disclosure is known e.g. from F. Boeuf et al.: "Silicon Photonics R&D and Manufacturing on 300-mm Wafer Platform," Journal of Lightwave Technology (Volume: 34, Issue: 2, Jan. 15, 2016), pp. 286-295.

There, an arrangement is disclosed where two chips are present, separated so that silicon technology can be used to produce the optical functions and can be optimized for these functions; separately, the same can be done for the electrical functions. The two chips may then be bonded together with electrical connections realized with Cu pillar technology.

An example of a fully packaged transceiver device can be seen in Narasimha et al.: "An Ultra Low Power CMOS Photonics Technology Platform for H/S Optoelectronic Transceivers at less than $1 per Gbps," 2010 Conference on Optical Fiber Communication (OFC/NFOEC), collocated National Fiber Optic Engineers Conference, and in Bazzoti et al.: "Silicon Photonics Assembly Industrialisation," European Microelectronics Packaging Conference (EMPC), 2015.

There, wirebonds from an organic substrate of the package may connect to the optical chip and through electrically-conductive traces on the optical chip and Cu pillars to the electrical chip.

Known wirebonding technologies may exhibit limits in terms of density and/or electrical performances at high frequency.

Accordingly, "bridge" type structures may be realized, see e.g., Hayakawa et al.: "Silicon Photonics Optical Transceiver for High-speed, High-density and Low-power LSI interconnect," Fujitsu SciTech Vol 52 No 1, pp 19-26.

That document relates to the possibility of replacing wirebond interconnections with soldered connections directly between the PCB and the electrical IC. However, such solution may have one or more disadvantages, e.g., it may be hardly feasible to perform a wafer level test on the 3D structure at wafer level, but only when the two integrated circuits ICs are assembled with the organic substrate (PCB): an increase in cost of testing may thus result.

Also, a solution related to silicon photonics chips that may be of some interest for the present disclosure may be known e.g. from C. Zwenger et al.: "Electrical and Thermal Simulation of SWIFT™ High-density Fan-out PoP Technology," 2017 IEEE 67th Electronic Components and Technology Conference.

SUMMARY

In accordance with an embodiment of the present invention, an optoelectronic device comprises an optical integrated circuit comprising a first surface and a second surface opposite the first surface. The optical integrated circuit comprises an optical zone of the first surface of the optical integrated circuit. The device includes an electrically insulating material disposed over the optical integrated circuit, the electrically insulating material partially covering the first surface so as to expose the optical zone.

In accordance with an embodiment of the present invention, a method for forming an optoelectronic device includes providing an optical integrated circuit including a first surface, the optical integrated circuit comprising an electrically-conductive bumped structure disposed over the first surface in a dam-like formation around an optical zone of the first surface. The method further includes applying a covering layer over the optical zone of the first surface of the optical integrated circuit; providing an electrical coupling network of the optical integrated circuit; and exposing the optical zone of the first surface of the optical integrated circuit.

In accordance with an embodiment of the present invention, an electro-optical system comprises a first layer having a first major surface and a second major surface and a second layer having a first major surface and a second major surface. The first layer and the second layer are coupled in a step-like structure with the second major surface of the second layer coupled with the first major surface of the first layer, with a portion of the first major surface of the first layer left uncovered by the second layer. The system includes an optical integrated circuit having a first surface and a second surface opposite the first surface, the optical integrated circuit comprising an optical zone of the first surface of the optical integrated circuit, the optical integrated circuit being surrounded by the second layer. The system includes an electrically insulating material disposed on the optical integrated circuit, the electrically insulating material partially covering the first surface so as to expose the optical zone; and an electrical integrated circuit. The second surface of the optical integrated circuit is disposed over the first major surface of the first layer, the optical zone of the first surface of the optical integrated circuit being exposed at a surface of the electro-optical system, and the electrical integrated circuit overlaps with a portion of the second layer and the optical integrated circuit.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
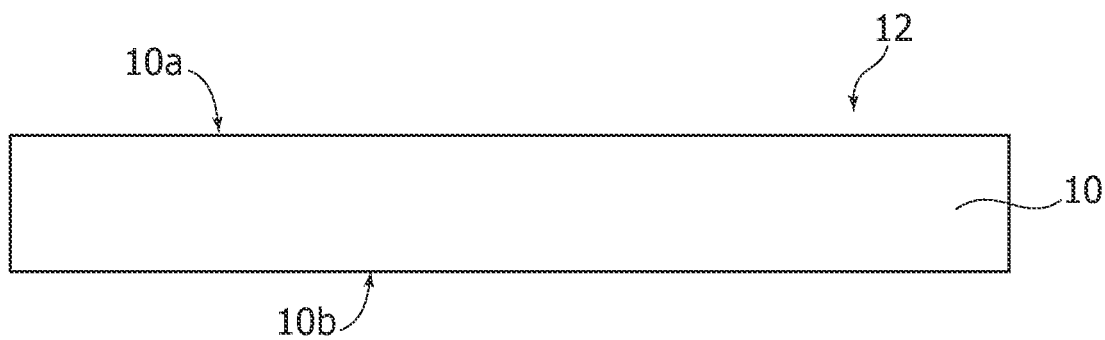
FIGS. 1 to 12 are exemplary cross-sectional views exhibiting features of a method for producing a 3D Silicon Photonics integrated circuit which may incorporate one or more embodiments.

It will be appreciated that, for the sake of clarity and simplicity, the various figures, and portions of such figures, may not be drawn to a same scale.

DETAILED DESCRIPTION OF ILLUSTRATIVE EMBODIMENTS

The description relates to production of semiconductor devices including both optical and electrical portions.

Silicon photonics chips comprising optical integrated circuits (OICs) and electrical integrated circuits (EICs) are exemplary of such semiconductor devices.

Despite extensive activity in the field, improved solutions are desirable. One or more embodiments contribute in providing such improved solutions. According to one or more embodiments, such a solution may be provided by means of a device having the features set forth in the claims that follow (for instance, a device having an exposed optical zone of the OIC).

One or more embodiments may include a corresponding electro-optical system (e.g. including such a device and an EIC) and a corresponding method.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

The present description relates to methods according to one or more embodiments, e.g. Fan-Out Wafer Level Packaging FO-WLP methods, that may be employed for producing an electro-optical system, e.g. an optical 3D stacked bridge package structure, including an optical integrated circuit OIC having respective one or more optical zones exposed at a surface of the electro-optical system, e.g. at the surface of the package.

As used herein, "optical zone" is intended to define a portion of the surface of an optical integrated circuit (OIC) where optical coupling may be achieved with one or more external components, e.g. optical fibers. Such an optical zone may comprise surface gratings, e.g. silicon photonics gratings. Also, an electro-optical system may comprise one or more back side illuminated gratings available at the back surface of the electro-optical system, wherein the light may pass through the back surface of the OIC, and a mirror provided at the grating may reflect light back into the grating.

FIG. 1 exemplifies a cross-sectional view of an OIC 10, comprising an optical zone 12 at a front surface 10a of the OIC 10. The following description of one or more embodiments will refer to the production of a single electro-optical system for brevity and for the sake of understanding. However, even if described with respect to a single electro-optical system, the steps of the assembly flow exemplified herein may be extended to an assembly flow of an array of electro-optical systems, by substituting the single OIC 10 represented in FIG. 1 with an OIC wafer, comprising a plurality of OICs 10 having respective optical zones 12, the plurality of OICs 10 being separated with respect to each other (e.g. via a dicing step) by a separation space.

Figure 2:
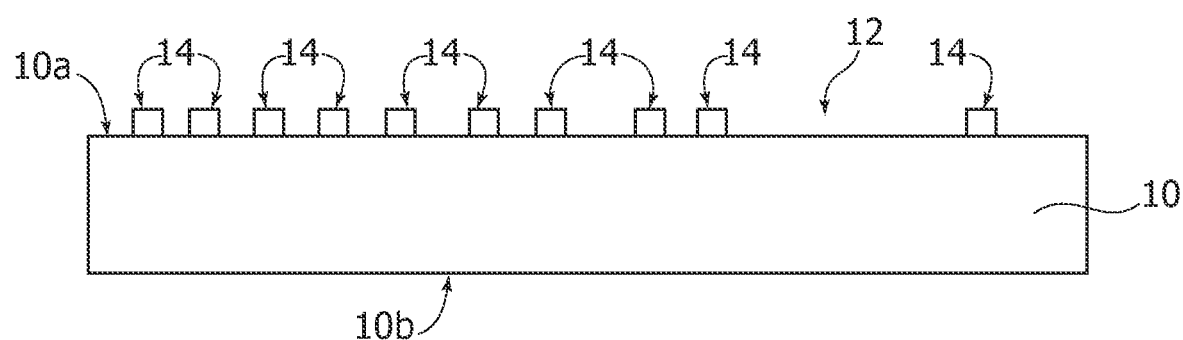

In one or more embodiments, as represented in FIG. 2, a plurality of solder bumps (e.g. a "micro" Cu/Ni Pillar solder stack) 14, that is a plurality of electrically-conductive formations, may be formed (e.g. via metal deposition) on the front surface 10a of the OIC 10. The solder bumps 14 may be arranged around the optical zone 12 of the OIC 10, for example selected ones 14 of the plurality of solder bumps 14 may be arranged away from the OIC 10, and selected ones 14 of the plurality of solder bumps 14 may be arranged surrounding the optical zone 12, e.g. forming a dam-like formation around such optical zone 12. Optionally, the dam-like formation formed around the optical zone 12 of the OIC 10 may be filled with filling material (not visible in FIG. 1).

Even if, in the present description, reference is made to a dam-like formation surrounding the optical zone 12, those of skill in the art will appreciate that such representation is purely exemplary of a variety of possible (external) temporary covering layers (e.g. of resist material) that may be configured for forming a closed perimeter around the optical zone 12.

Figure 3:
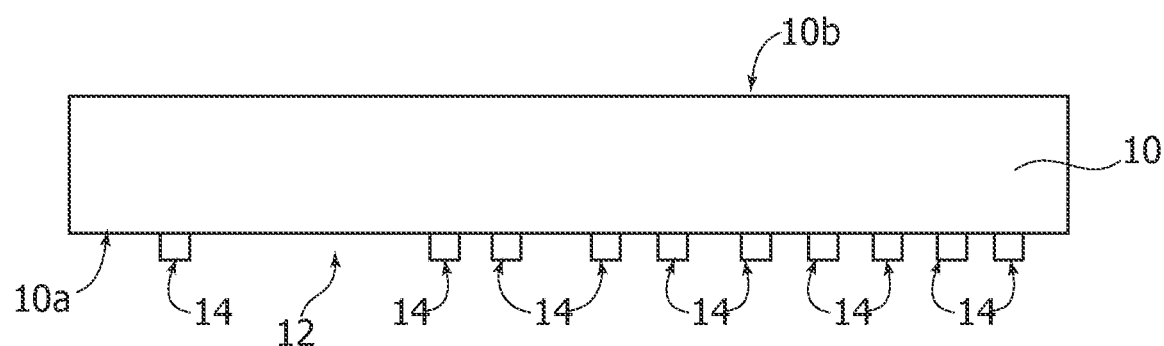
Figure 4:
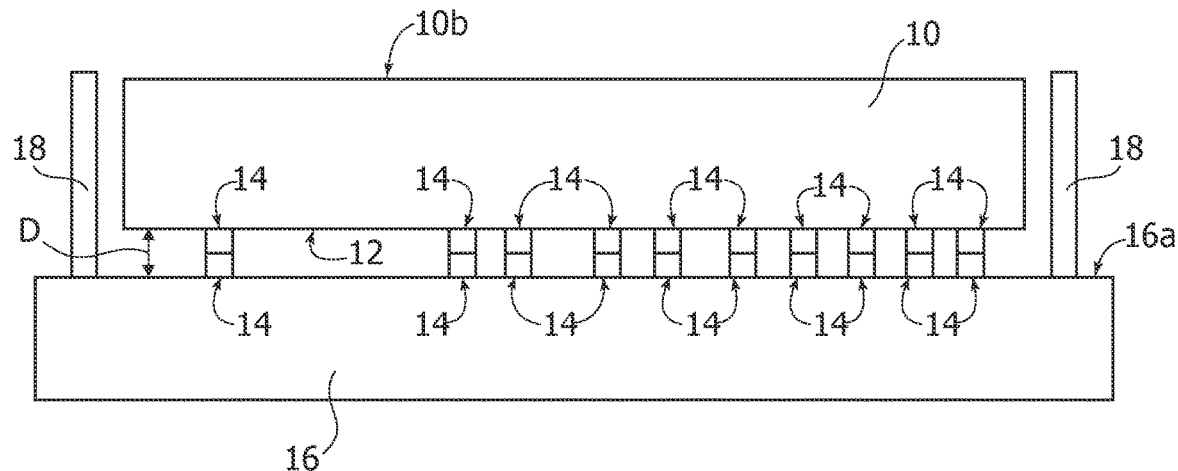

As represented in FIGS. 3 and 4, the OIC 10 may be flipped and the front surface 10a thereof may be arranged at (e.g. attached to) a sacrificial carrier layer 16. The OIC 10 may thus have a back surface 10b, opposite to the front surface 10a, that may be left exposed.

Such a step may be desirable if the electro-optical system comprises one or more back side illuminated gratings available at the back surface of the electro-optical system, wherein the light may pass through the back surface 10b of the OIC 10, and a mirror may be provided at the grating that may reflect light back into the grating. On the sacrificial carrier layer 16, a plurality of further solder bumps 14 may be formed, configured for coupling to the plurality of solder bumps 14 on the front surface 10a of the OIC 10, and complementary thereto.

Accordingly, the front surface 10a may face the carrier layer 16 and may lie at a distance D therefrom, that may be indicative of an height of the plurality of solder bumps 14 plus an height of the plurality of further solder bumps 14.

In one or more embodiments, a covering layer of the optical zone 12 of the OIC 10 may thus be formed by means of standard polymer resist processes. Such contact may be able to enclose and optionally insulate the optical zone 12 from its surrounding.

Also, as represented in FIG. 4, one or more electrically-conductive pillars 18, e.g. made of copper, may be formed on the front surface 16a of the carrier layer 16, wherein the pillars 18 may be arranged sidewise (e.g. surrounding) the OIC 10. It will be appreciated that, in case an OIC wafer is present, a plurality of pillars 18 may be present, arranged on the front surface 16a of the carrier layer 16 at the separation spaces between different OICs 10.

Figure 5:
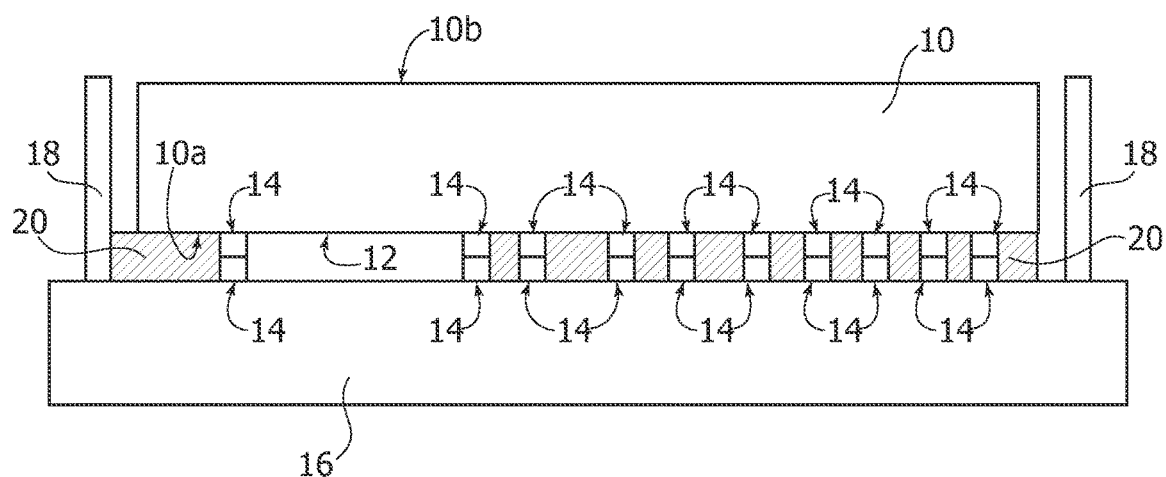

FIG. 5 represents an underfilling step, wherein filling material 20 may be applied on the front surface 16a of the carrier layer 16. The filling material 20 may fill the distance D between the front surface 10a of the OIC 10 and the front surface 16a of the carrier layer 16, filling also certain spaces between the plurality of solder bumps 14. It will be appreciated that the covering layer, as exemplified in FIG. 5, prevents the filling material 20 from filling the distance D between the front surface 10a of the OIC 10 and the front surface 16a of the sacrificial carrier layer 16, at the optical zone 12 of the OIC 10.

Figure 6:
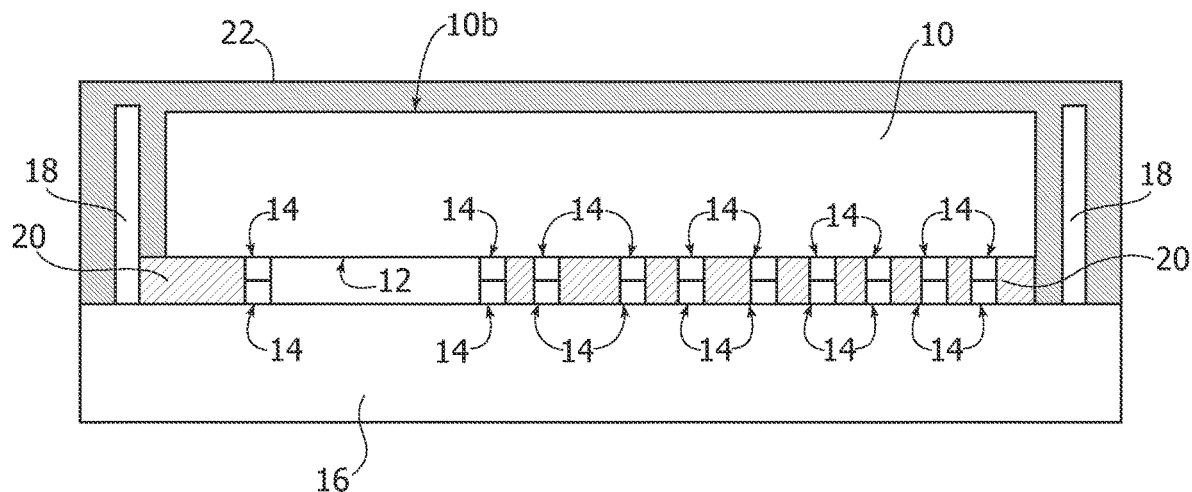

Also, molding material 22 may be applied, as represented in FIG. 6. Here, the molding material 22 may be applied over the front surface 16a of the carrier layer 16 as well as on the pillars 18 and the back surface 10b of the OIC 10.

Figure 7:
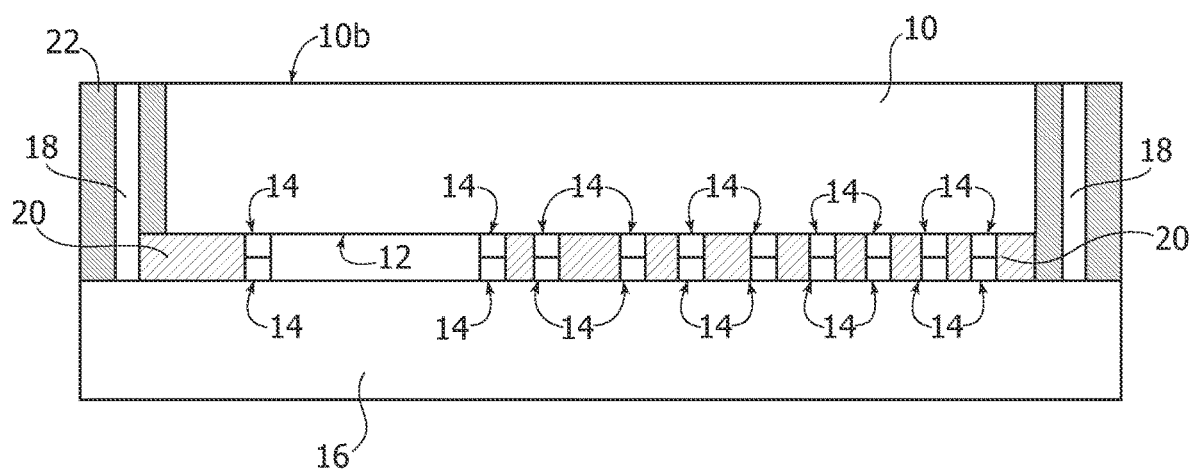

The back surface 10b of the OIC 10 and the pillars 18 may thus be completely covered by the molding material 22 and a thinning step may be performed, as represented in FIG. 7, wherein the molding material 22 may be removed until the pillars 18 may be exposed.

Figure 8:
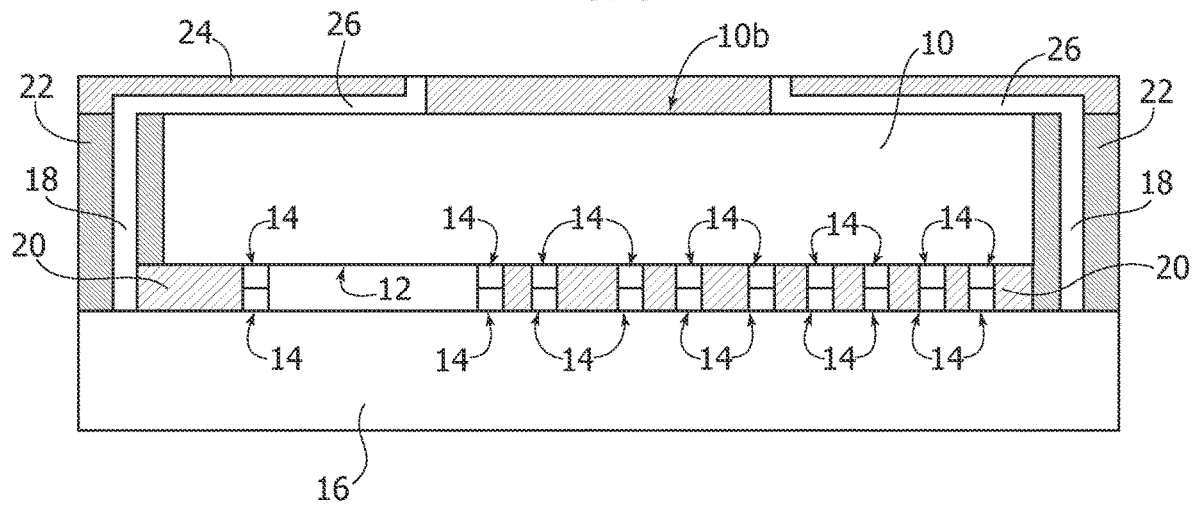

As exemplified in FIG. 8, one or more RDL redistribution layers may be provided on the molding material 22. In one or more embodiments, a covering layer 24 may be provided, covering the pillars 18 and the back surface 10b of the OIC 10 (if exposed), and routed electrically-conductive traces 26 may extend in the covering layer 24, the traces 26 forming an electrically-conductive network. For example, the pillars 18 may be connected to respective conductive traces 26 that may have one or more portions exposed at a surface of the covering layer 24.

Figure 9:
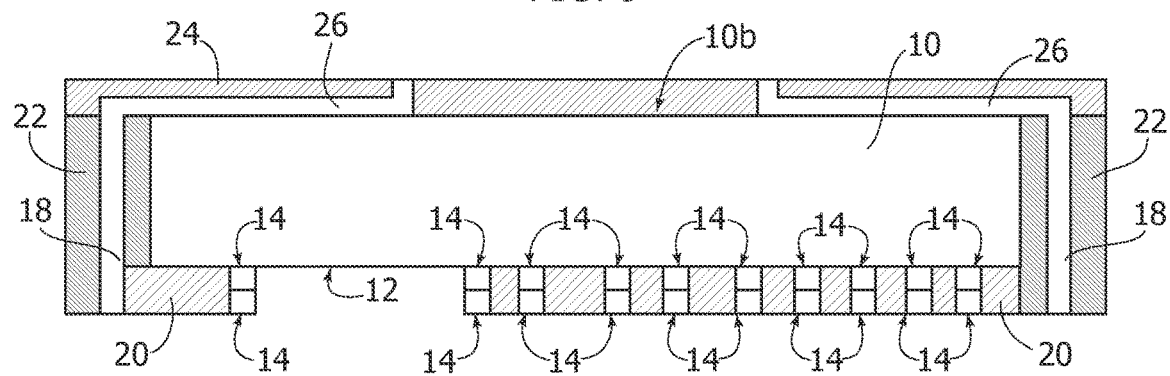

In FIG. 9, the sacrificial carrier layer 16 may be removed. Also, if the dam-like formation surrounding the optical zone 12 of the OIC 10 is filled with filling material, e.g. a resist, a removal of the filling material may be performed. Accordingly, a recessed portion may be formed, surrounded by the filling material 20, wherein, at a bottom surface, the optical zone 12 of the OIC 10 may be exposed.

The produced (optical) device may thus be coupled to an electrical integrated circuit EIC 28 to form an electro-optical system according to one or more embodiments as described in the following.

Figure 10:
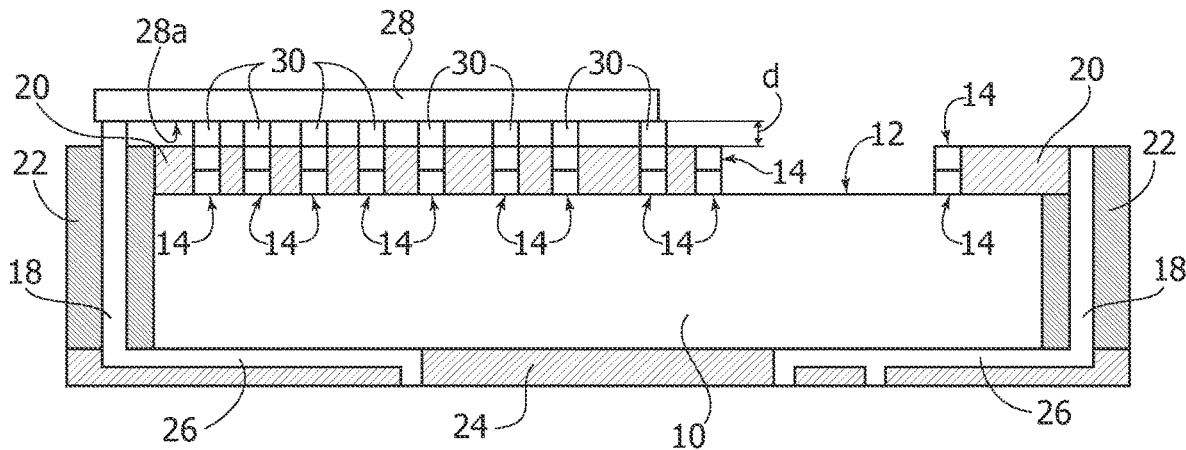

For example, in FIG. 10, the electrical integrated circuit EIC 28 may have a front surface 28a comprising an active surface and metal layers, e.g. the front surface 28a may comprise a plurality of die pads 30. The EIC 28 may be arranged with the front surface 28a facing the front surface 10a of the OIC 10, that is the front surface of the device, with the plurality of die pads 30 coupled with respective solder bumps in the plurality of solder bumps 14. Also, as represented in FIG. 10, the EIC 28, at its front surface 28a, may be coupled to one of the pillars 18, e.g. a via passing through the molding material 22 or, in alternative embodiments, through a glass chip or a silicon chip.

It will be appreciated that the EIC 28 may be arranged in contact with the selected ones of the plurality of solder bumps 14 away from the optical zone 12, whereas none of the selected ones of the solder bumps 14 forming the dam-like formation may be coupled to the EIC 28. The EIC 28 may therefore cover a portion of the front surface 10a of the OIC 10 away from the optical zone 12.

As represented in FIG. 10, a distance d may be present between the front surface 28a of the EIC 28 and the front surface 10a of the OIC 10, that may in the present embodiment correspond to a height of the die pads 30 of the EIC 28.

Figure 11:
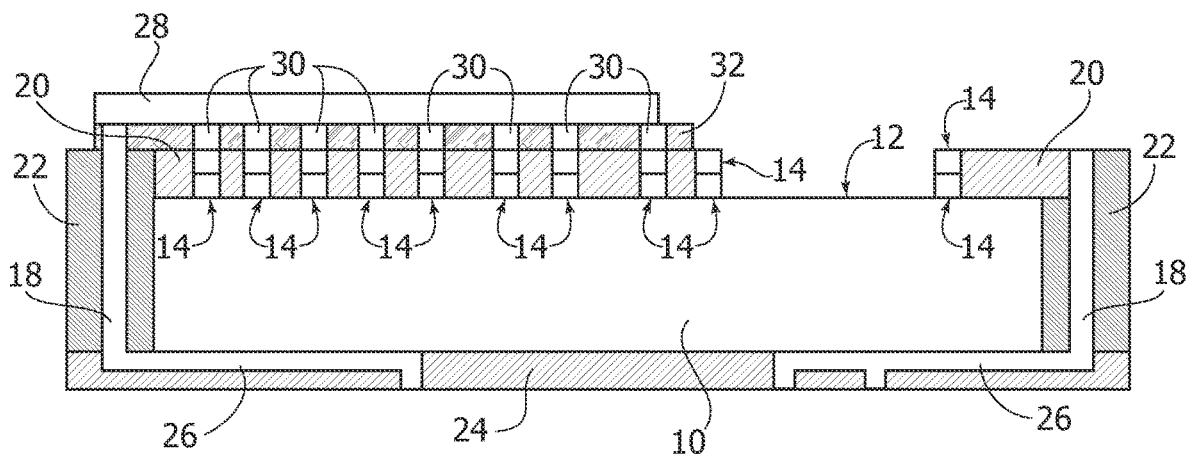

A further underfilling step may be performed, as represented in FIG. 11, wherein further filling material 32, which may or may not correspond to the filling material 20, may be applied on the front surface 10a of the OIC 10. The further filling material 32 may fill completely the distance d between the front surface 10a of the OIC 10 and the front surface 28a of the EIC 28, filling also the spaces between the plurality of die pads 30.

Figure 12:
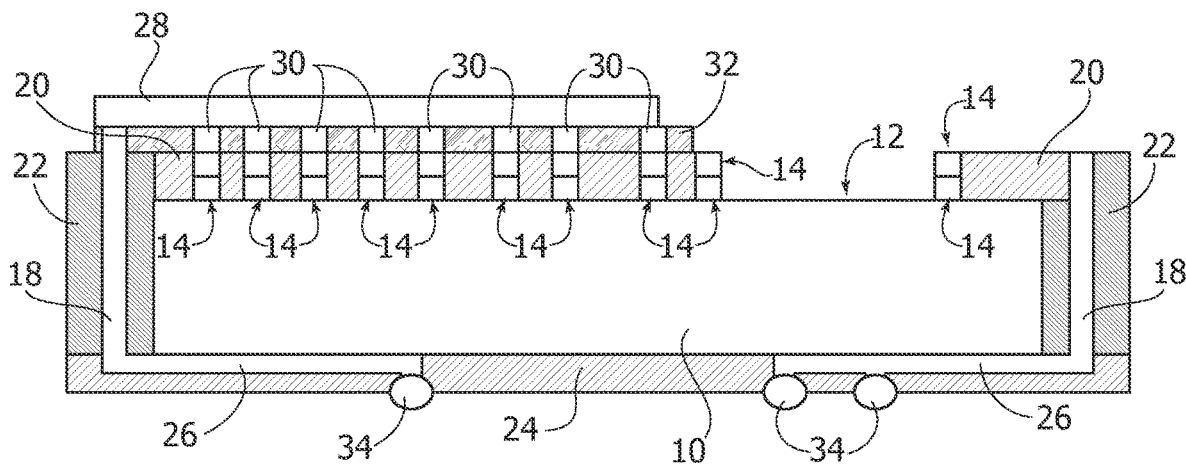
Figure 13:
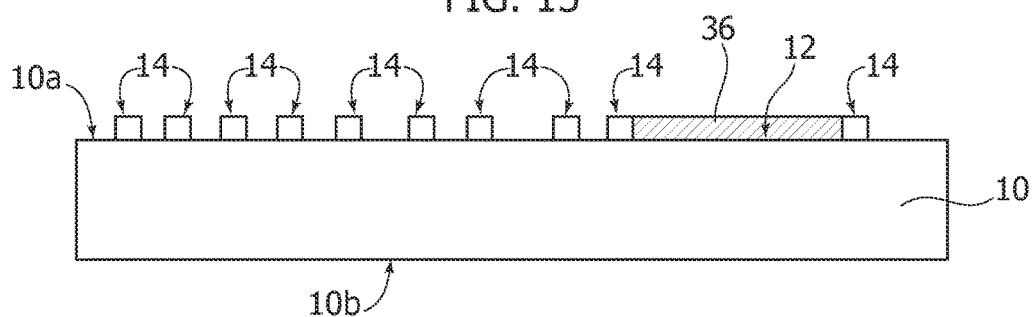
FIGS. 13 to 20 are exemplary cross-sectional views exhibiting features of a method for producing an OIC which may incorporate one or more embodiments.

FIG. 12 represents the possibility of providing solder balls 34 at a back surface of the electro-optical system, at portions thereof whereby the electrically-conductive traces 26 may be exposed, that is the solder balls 34 may be formed in direct contact to the exposed portions of the electrically-conductive traces 26 forming the electrical conductive network of the electro-optical system according to one or more embodiments.

Also, the assembly flow process may comprise a singulation step performed to the OIC wafer, so that the electro-optical systems may be divided.

In the following FIGS. 13 to 20, parts or elements like parts or elements already discussed in connection with FIGS. 1 to 12 are indicated with like references and a corresponding detailed description will not repeated for the sake of brevity.

In one or more embodiments, an assembly flow process that may produce the device according to one or more embodiments may comprise filling with filling material 36, e.g. a resist, the dam-like formation formed around the optical zone 12 of the OIC 10. Such a step may provide one or more advantages, for example the filling/covering material may protect the optical zones (e.g. gratings) during different assembly process steps, such as RDL applying, pillar growth, molding operations. Also, once the filling material is removed, the optical zone, e.g. the optical coupling region, may be left exposed.

Figure 14:
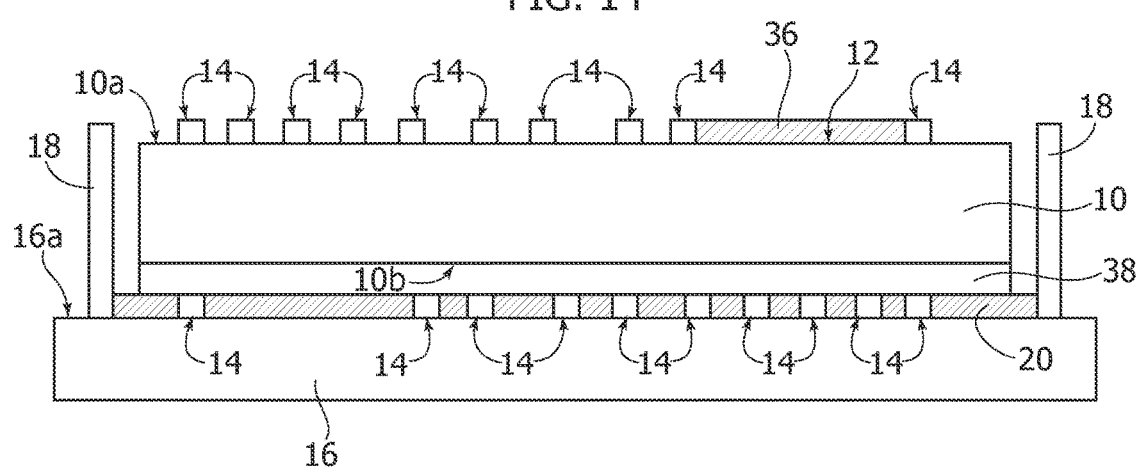

As represented in FIG. 14, the back surface 10b of the OIC 10 may be arranged at the front surface 16a of the sacrificial carrier layer 16, and the front surface 10a of the OIC 10 may thus be left exposed. Such arrangement may be desirable in case the optical areas comprise grating structures at the optical zone 12 on the front surface 10a of the OIC 10, the grating structures configured to transmit light upwards, out of this front surface 10a.

In the present non-limiting example, on the front surface 16a of the sacrificial carrier layer 16, the plurality of further solder bumps 14 may be formed as well as the one or more pillars 18, e.g. made of copper. Spaces between the plurality of further solder bumps 14 and the pillars 18 may be filled with underfilling material 20 and the back surface 10b of the OIC 10 may be attached, via an adhesive 38, to the plurality of further solder bumps 14 and the filling material 20 filling the spaces therebetween.

One or more embodiments may comprise providing one or more RDL layers, that may in turn comprise a plurality of layers, e.g. a passivation layer, a metal layer and a further passivation layer. These layers may connect a portion of the front surface 10a of the OIC 10, e.g. arranged below the RDL layer, via (e.g. routed) electrically-conductive traces through the metal layer, to an electrically-conductive portion of an exposed surface of the RDL layer, e.g. at a different point with respect to the portion of the front surface 10a of the OIC 10.

Figure 15:
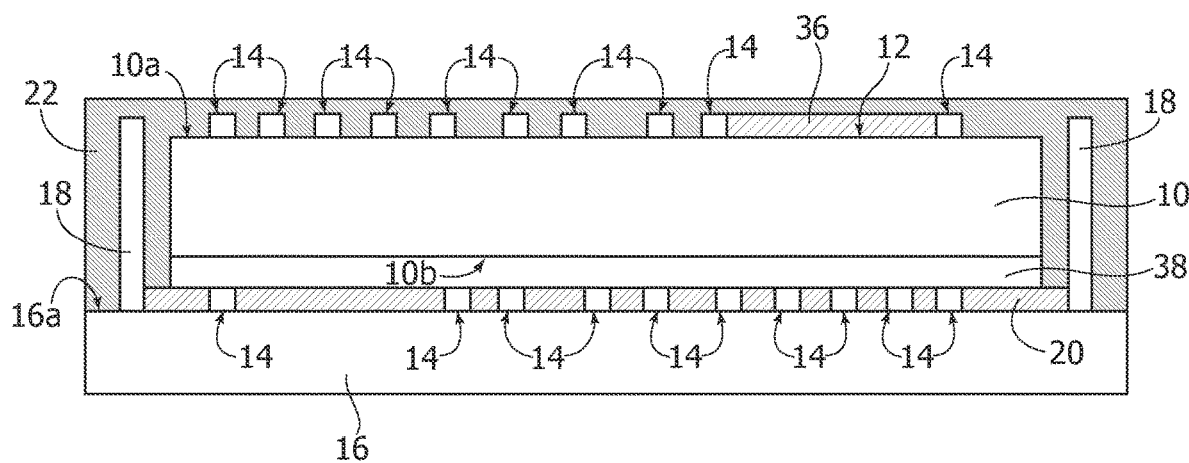

Also, molding material 22 may be applied, as represented in FIG. 15. Here, molding material 22 may be applied over the front surface 16a of the carrier layer 16, thereby (e.g., completely) covering the pillars 18, the front surface 10a of the OIC 10 as well as the space therebetween.

Figure 16:
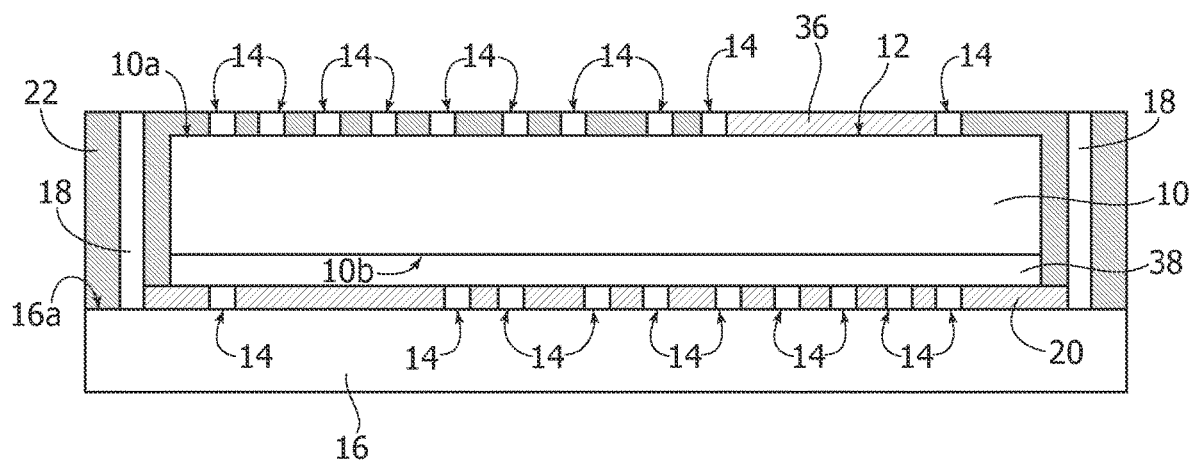

A thinning step may be performed, as represented in FIG. 16, wherein the molding material 22 may be removed until the pillars 18 may be exposed, e.g. also exposing the plurality of solder bumps 14 and the filling material 36 present at the front surface 10a of the OIC 10.

In one or more embodiments, one or more RDL redistribution layers (not visible) may be applied over the thinned molding material 22 and the electrically-conductive traces 26 may be produced, forming an electrically-conductive network. For example, the pillars 18 may be connected to respective electrically-conductive traces 26 that may extend over the front surface 10a of the OIC 10. In one or more embodiments, the electrically-conductive traces 26 may connect one or more pillars 18 with selected ones of the plurality of solder bumps 14 on the front surface 10a of the OIC 10.

Figure 17:
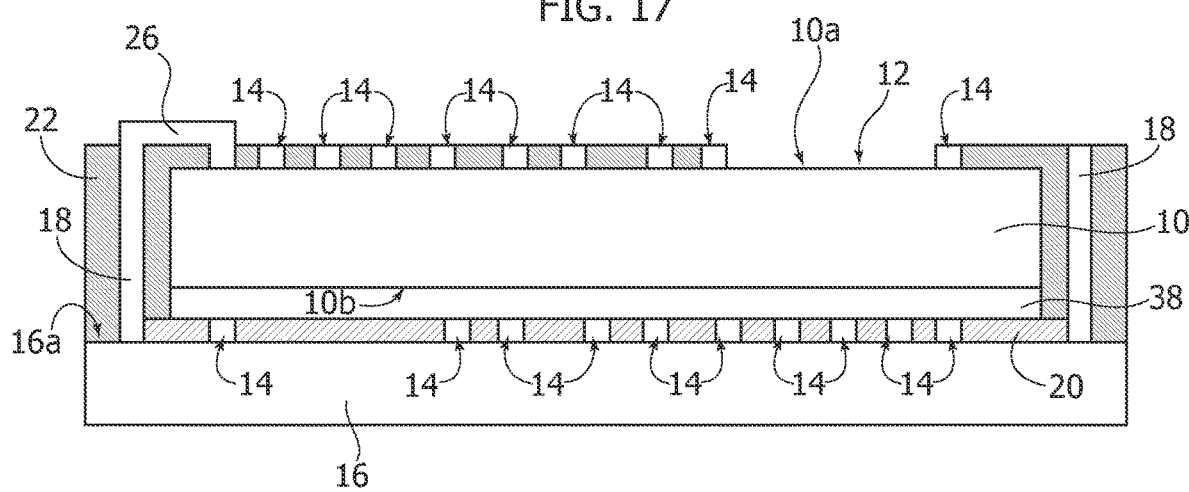

Also, as exemplified in FIG. 17, the filling (e.g., resist) material 36, e.g. a resist covering the optical zone 12 of the OIC 10, may be removed and the optical zone 12 may thus remain exposed at the front side 10a of the OIC 10. Accordingly, a recessed portion may be formed, surrounded by the molding material 22, wherein, at a bottom surface, the optical zone 12 of the OIC 10 may be exposed.

Figure 18:
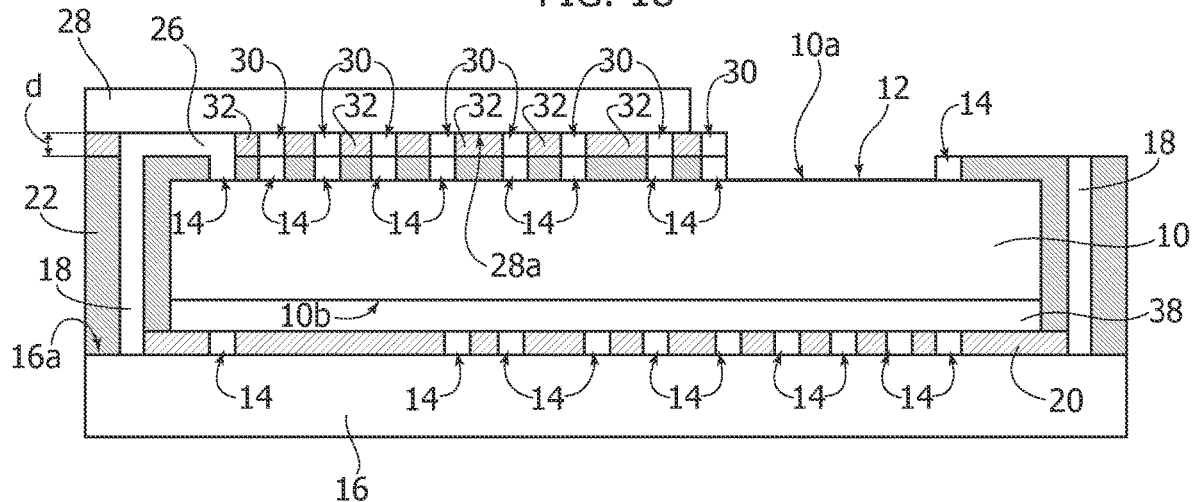

The produced (optical) device may then be electrically coupled to the electrical integrated circuit EIC 28 having the die pads 30 at the front surface 28a thereof, to form an electro-optical system according to one or more embodiments as exemplified in FIG. 18. For example, the EIC 28 may be arranged with the front surface 28a facing the front surface 10a of the OIC 10, with the plurality of die pads 30 coupled with the respective solder bumps in the plurality of solder bumps 14 (as well as respective pillars 18, if electrically-conductive traces 26 are present connecting the pillars 18 to corresponding solder bumps in the plurality of solder bumps 14). Again, the EIC 28 may be arranged in contact with the selected ones of the plurality of solder bumps 14 away from the optical zone 12, and the EIC 28 may cover a portion of the front surface 10a of the OIC 10 away from the optical zone 12 that may thus be left exposed. Again, the distance d between the front surface 28a of the EIC 28 and the front surface 10a of the OIC 10 may be covered with further filling material 32, which may or may not correspond to the filling material 20. The further filling material 32 may fill completely the distance d, filling also the spaces between the plurality of die pads 30.

Figure 19:
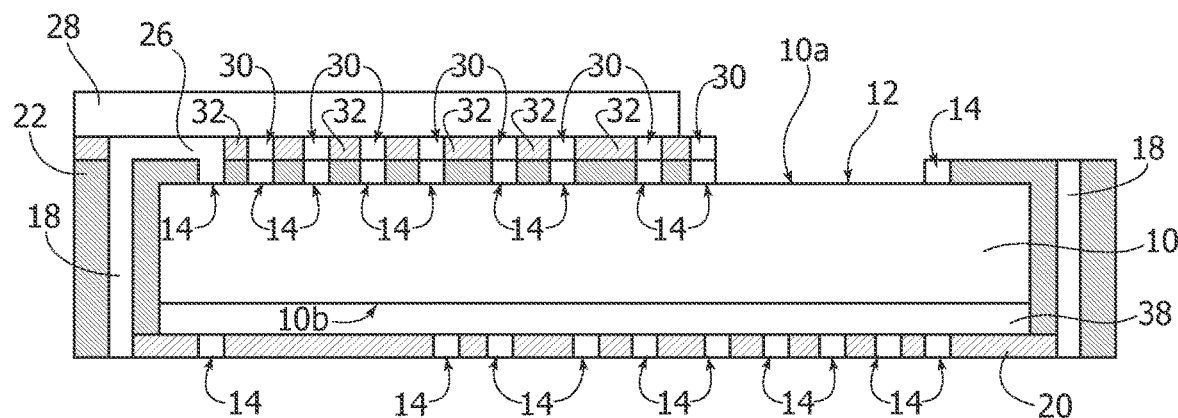

In FIG. 19, the sacrificial carrier layer 16 may be removed, so that a surface comprising the filling material 20 as well as the plurality of further solder bumps 14 may be exposed.

Figure 20:
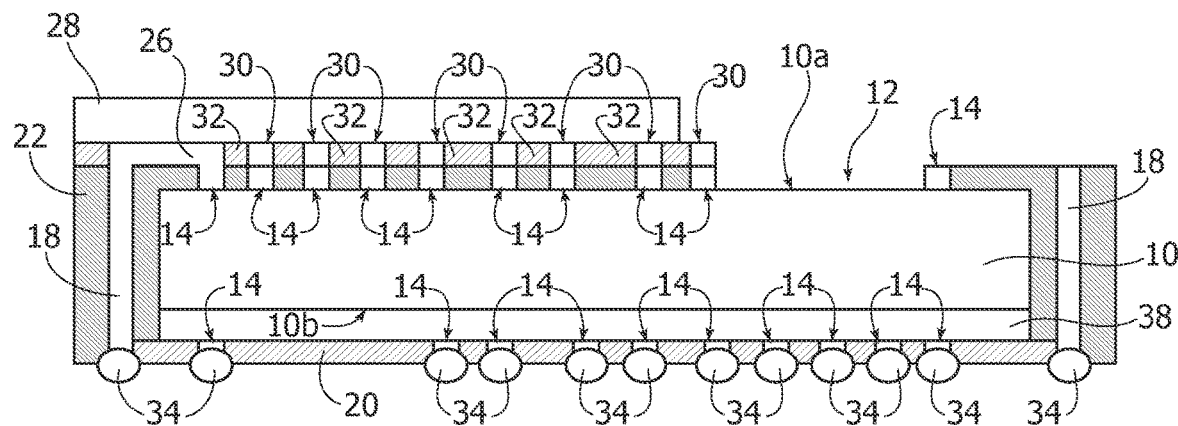

FIG. 20 represents the possibility of providing the solder balls 34 at such surface, at the portions thereof wherein the pillars 18 (e.g. through mold pillars) as well as the plurality of further solder bumps 14 may be exposed, that is the solder balls 34 may be formed in direct contact to the exposed portions thereof.

Also, a singulation step may be performed in the assembly flow according to one or more embodiments, in order to isolate the different electro-optical systems produced on the OIC wafer.

Figure 21:
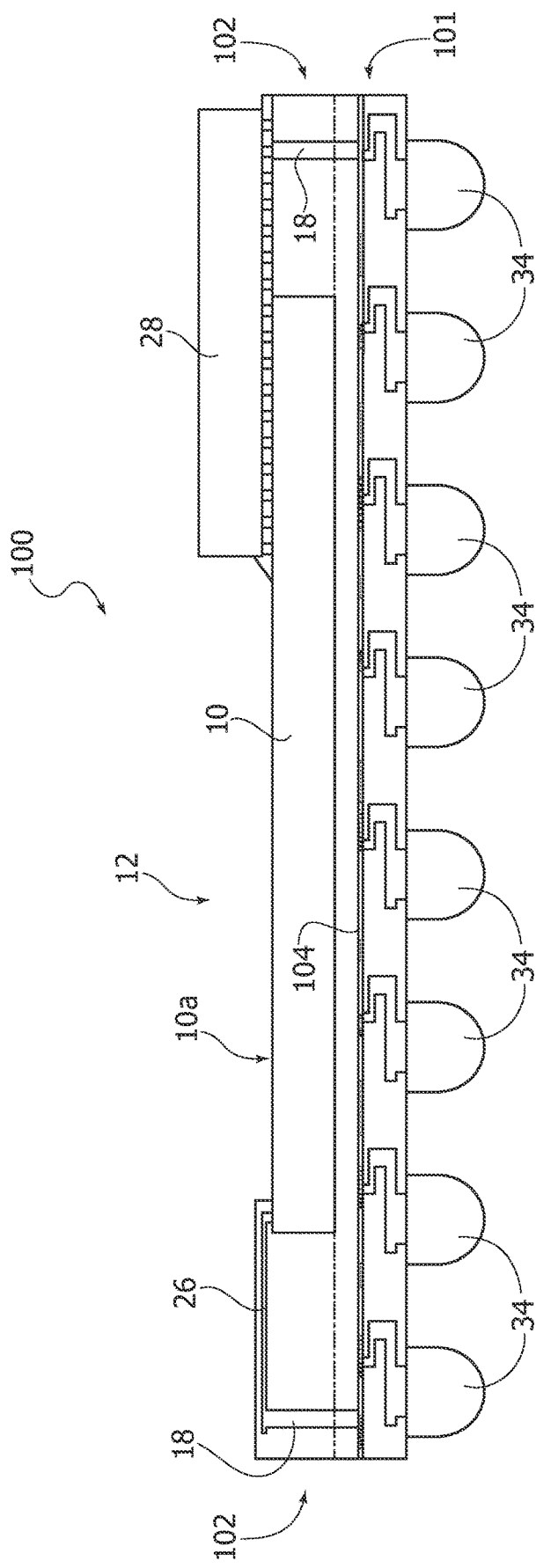
FIG. 21 is exemplary of features of an electro-optical system according to one or more embodiments.

FIG. 21 exemplifies a possible electro-optical system 100 that may be produced via the method according to one or more embodiments, comprising an OIC 10 and an EIC 28. As exemplified herein, the system 100 may comprise a 3D layered structure, wherein the electrical integrated circuit EIC 28 may be mounted, e.g. by flip-chip mounting, on the optical integrated circuit OIC 10. In turn, the OIC 10 of such electro-optical system 100 may comprise one or more optical zones 12, exposed at a front surface of the system 100. For example, the optical zone 12 may lie within a recessed portion of the front surface of the system 100, the recessed portion having a thickness that may substantially correspond to the height of the plurality of further solder bumps 14.

In one or more embodiments, as exemplified in FIG. 21, the traces 26, e.g. the trace 26 connecting the pillar 18 to the front surface 10a of the OIC 10, may be covered by a passivation layer on top of the traces 26.

Also, in one or more embodiments, one or more pillars/vias 18 can be connected, via the pillars/bumps 30, to the EIC 28, insofar as the EIC 28 can comprise its own metal layers that can be designed to redistribute the electrical signals.

Electrical connections between the EIC 28 and the OIC 10 may be provided e.g. by copper pillars 18, the plurality of solder bumps 14 (and/or the plurality of further solder bumps 14) as well as the electrically-conductive traces 26, that may be deposited partially on the OIC 10 and partially on the EIC 28. Assembling the EIC 28 on the OIC 10 may involve a wafer-level process, e.g. by reflow of the solder paste of the copper pillars obtained by means of a mass reflow process. The resulting 3D structure may be tested at wafer level (e.g. during Electro-Optical Wafer Sorting—EOWS).

The 3D wafer may then be singulated and each 3D semi-finished device assembled onto e.g. an organic package for characterization activities. Alternatively, it can be directly mounted on an end-user board e.g. within a module.

Electrical connections between the 3D assembly and e.g. an external board may be provided via the solder balls 34 that may be similarly connected to the electrical connections discussed above.

In one or more embodiments, the EIC 28 may be attached at least partially onto the OIC 10, e.g. away from the optical zone 12 on the front surface 10a thereof and partially on a resulting step-wise package giving rise to a sort of bridge-like arrangement. For example, the electro-optical system 100 may comprise a first layer 101 and a second layer 102, having longitudinal dimensions smaller than longitudinal dimensions of the first layer 101, wherein the first layer 101 and the second layer 102 may be coupled in a step-like structure, with the second layer 102 arranged at a peripheral portion of the first layer 101 and having a thickness that may be higher than a thickness of the OIC 10. For example, the thickness of the second layer 102 may correspond to the height of the plurality of further solder bumps 14 plus the thickness of the OIC 10.

In one or more embodiments, an electrical coupling network may be present in the first 101 and second 102 layer that may comprise the electrical connections of the OIC 10 plus EIC 28, the electrically-conductive traces 26, the plurality of solder bumps 14 (and/or the plurality of further solder bumps 14 depending on the assembly process employed) and the pillars 18. Also, the electrical coupling network may extend in a network layer 104 within the first layer 101 of the electro-optical system 100.

In one or more embodiments, the OIC 10 may be arranged with its back surface 10b coupled to the first layer 101 at the portion thereof left uncovered by the second layer 102, e.g. at a central portion of the first layer 101. Accordingly, the optical zone 12 of OIC 10 may remain exposed at the front surface of the electro-optical system 100.

In one or more embodiments, the EIC 28 may be coupled, at its front surface 28a, with the second layer 102 and the front surface 10a of the OIC 10, away from the optical zone 12 of the OIC 10, so that the EIC 28 may be arranged extending bridge-like between the second layer 102 and the OIC 10.

In one or more embodiments, as exemplified herein, the second layer 102 may extend around the OIC 10, thereby covering (all) portions of a surface of the first layer 101 that may be left uncovered by the OIC 10.

In one or more embodiments, the OIC 10 and the EIC 28 may exchange position in the electro-optical system 100, thereby the OIC 10 may be arranged over the second layer 102 and the EIC 28, which in turn may be placed in the recessed portion over the first layer 101. For example, in this case, the OIC 10 may be coupled at the front surface 10a to the EIC 28 and may comprise the optical zone 12 at the back surface 10b, that may be left exposed and that may comprise back side illuminated gratings.

Thanks to the method according to one or more embodiments, the possibility exists of: performing a die attach step instead of a flip-chip bumping, opening of the top molded (e.g. resist) layer of the device to expose optical zones, e.g. silicon photonics gratings, using RDL material to provide an electrical connection network, e.g. metalizing the top molding compound, performing (e.g. Cu) pillar growth on reconstituted wafer, performing a standard flip-chip of the EIC, performing a wafer level electro-optical testing of a reconstituted wafer.

One or more embodiments may relate to a device, comprising:
an optical integrated circuit (e.g. 10) having a first surface (e.g. 10a) and a second surface (e.g. 10b) opposite the first surface, the optical integrated circuit comprising an optical zone (e.g. 12) of the first surface of the optical integrated circuit, and
at least one electrically insulating mass (e.g. 20, 22) applied onto the optical integrated circuit, the at least one electrically insulating mass leaving the optical zone at the first surface of the optical integrated circuit uncovered.

In one or more embodiments, the device may comprise an electrical coupling network of the optical integrated circuit, the electrical coupling network may comprise one or more of: at least one electrically conductive formation extending through the at least one electrically insulating mass, at least one electrically conductive formation extending between the first surface and the second surface of the optical integrated circuit, and/or electrically conductive formations selected out of electrically conductive pillars, through glass vias and through silicon vias.

In one or more embodiments, the optical integrated circuit may comprise an electrically-conductive bumped structure (e.g. 14) at the first surface, the electrically-conductive bumped structure providing a dam-like formation around the optical zone of the first surface of the optical integrated circuit.

One or more embodiments may relate to a method of producing such a device, comprising:
providing an optical integrated circuit (e.g. 10) having a first surface (e.g. 10a) with one or more temporary covering layers that may be configured for forming a closed perimeter around an optical zone (e.g. 12) of the first surface of the optical integrated circuit (for example, an electrically-conductive bumped structure such as 14 on the first surface of the OIC providing a dam-like formation around the optical zone), applying a covering layer (e.g. 14, 16; 36) over the optical zone of the first surface of the optical integrated circuit, providing an electrical coupling network of the optical integrated circuit, and removing the covering layer to expose the optical zone of the first surface of the optical integrated circuit.

One or more embodiments may comprise molding electrically insulating mass (e.g. 20, 22) onto the optical integrated circuit having the covering layer applied over the optical zone of the first surface of the optical integrated circuit.

One or more embodiments may comprise providing the covering layer bridge-like across the dam-like formation, the covering layer extending at a distance (e.g. D) to the optical zone of the first surface of the optical integrated circuit.

One or more embodiments may comprise providing a sacrificial carrier layer (e.g. 16) and coupling therewith the optical integrated circuit with the first surface of the optical integrated circuit facing the sacrificial carrier layer, wherein the sacrificial carrier layer may provide the covering layer extending at the distance (e.g. D) to the optical zone of the first surface of the optical integrated circuit.

In one or more embodiments, providing the electrical coupling network of the optical integrated circuit may comprise: providing the sacrificial carrier layer with an electrically-conductive structure (e.g. 14) complementary to the electrically-conductive bumped structure at the first surface of the optical integrated circuit and electrically coupling the electrically-conductive bumped structure at the first surface of the optical integrated circuit with the complementary electrically-conductive structure of the sacrificial carrier layer; and/or providing electrically-conductive formations (e.g. 18) from the sacrificial carrier layer towards a second surface (e.g. 10b) of the optical integrated circuit, the second surface opposite the first surface.

One or more embodiments may comprise providing electrically-conductive formations (e.g. 26) from the sacrificial carrier layer towards a second surface (e.g. 10b) of the optical integrated circuit opposite the first surface, subsequent to at least partially removing, at the second surface, electrically insulating mass molded onto the optical integrated circuit.

One or more embodiments may comprise removing the sacrificial carrier layer to expose the optical zone of the first surface of the optical integrated circuit as well as the electrical coupling network of the optical integrated circuit at the first surface of the optical integrated circuit.

One or more embodiments may comprise providing the covering layer in contact with the optical zone of the first surface, optionally by providing a filling (e.g. 36) of protective material over an optical zone of the first surface of the optical integrated circuit.

One or more embodiments may comprise providing a sacrificial carrier layer (e.g. 16) and coupling therewith the optical integrated circuit with a second surface (e.g. 10b) of the optical integrated circuit facing the sacrificial carrier layer, the second surface of the optical integrated circuit opposite the first surface of the optical integrated circuit.

In one or more embodiments, providing the electrical coupling network of the optical integrated circuit (10) may comprise: providing the sacrificial carrier layer with an electrically-conductive structure (e.g. 14) and electrically coupling the optical integrated circuit with the electrically-conductive structure of the sacrificial carrier layer; and/or providing electrically-conductive formations (e.g. 18) from the sacrificial carrier layer towards electrically-conductive bumped structure on the first surface (10a) of the optical integrated circuit.

One or more embodiments may comprise providing electrically-conductive formations (e.g. 26) from the sacrificial carrier layer towards the electrically-conductive bumped structure on the first surface of the optical integrated circuit subsequent to at least partially removing, at the first surface, electrically insulating mass (e.g. package material 20, 22) molded onto the optical integrated circuit.

One or more embodiments may comprise removing the covering layer in contact with the optical zone of the first surface to expose the optical zone of the first surface of the optical integrated circuit.

One or more embodiments may comprise removing the sacrificial carrier layer to expose the electrical coupling network of the optical integrated circuit at the second surface of the optical integrated circuit.

One or more embodiments may relate to an electro-optical system (e.g. 100), comprising: a first layer (e.g. 101) having a front surface and a back surface, a second layer (e.g. 102) having a front surface and a back surface, wherein the first layer and the second layer may be coupled in a step-like structure with the back surface of the second layer coupled with the front surface of the first layer, with a portion of the front surface of the first layer left uncovered by the second layer, a device according to one or more embodiments, and an electrical integrated circuit (e.g. 28), wherein the second surface of the optical integrated circuit may be coupled with the front surface of the first layer at the portion left uncovered by the second layer, the optical zone of the first surface of the optical integrated circuit being exposed at a surface of the electro-optical system, and wherein the electrical integrated circuit may be coupled with the front surface of the second layer and the first surface of the optical integrated circuit, by leaving the optical zone at the first surface of the optical integrated circuit uncovered, with the electrical integrated circuit arranged extending bridge-like between the second layer and the optical integrated circuit.

In one or more embodiments, the electro-optical system may comprise a further chip, embedded in the second layer, wherein the electrical coupling network of the optical integrated circuit may comprise at least one electrically-conductive formation extending through the further chip.

In one or more embodiments, the (e.g. Cu) pillar structure, connecting top and bottom surfaces of the electro-optical system may be replaced by:

a glass interposer chip containing through glass vias, or
a separate electrical IC chip having vias therein that may be used instead of the through mold pillars.

For example, the chip may comprise a central processing unit CPU of a high end server, and may comprise silicon with TSV Through-Silicon Vias, glass with TGV Through-Glass Vias or ceramic. In one or more embodiments, the chip may comprise an active chip such as an ASIC Application Specific Integrated Circuit.

It will be appreciated that, in one or more embodiments, producing a 3D wafer level package structure may permit (full) wafer level testing enabling only Known good 3D to be assembled reducing overall package cost.

Without prejudice to the underlying principles, the details and embodiments may vary, even significantly, with respect to what has been disclosed by way of example only, without departing from the extent of protection.

What is claimed is:

1. A optoelectronic device comprising:
an optical integrated circuit comprising a first surface and a second surface opposite the first surface, the optical integrated circuit comprising an optical zone of the first surface of the optical integrated circuit, the optical integrated circuit comprising an electrically-conductive bumped structure comprising a plurality of electrically-conductive solder bumps disposed over the first surface, wherein a subset of the electrically-conductive solder bumps define a closed perimeter around an optical zone of the first surface, the optical zone comprising an optical cavity having sidewalls formed from a sidewall of each of the subset of the electrically-conductive solder bumps;
an electrical integrated circuit disposed over the first surface of the optical integrated circuit: and
an electrically insulating material disposed on the optical integrated circuit, the electrically insulating material partially covering the first surface so as to expose the optical zone.

2. The device of claim 1, further comprising an electrical coupling network of the optical integrated circuit, the electrical coupling network comprising an electrically conductive formation extending through the electrically insulating material.

3. The device of claim 1, further comprising an electrical coupling network of the optical integrated circuit, the electrical coupling network comprising an electrically conductive formation extending between the first surface and the second surface of the optical integrated circuit.

4. The device of claim 1, further comprising an electrical coupling network of the optical integrated circuit, the electrical coupling network comprising electrically conductive pillars, through glass vias, or through silicon vias.

5. An electro-optical system comprising:
a first layer having a first major surface and a second major surface;
a second layer having a first major surface and a second major surface, wherein the first layer and the second layer are coupled in a step-like structure with the second major surface of the second layer coupled with the first major surface of the first layer, with a portion of the first major surface of the first layer left uncovered by the second layer,
an optical integrated circuit having a first surface and a second surface opposite the first surface, the optical integrated circuit comprising an optical zone of the first surface of the optical integrated circuit, the optical integrated circuit comprising an electrically-conductive bumped structure comprising a plurality of electrically-conductive solder bumps disposed over the first surface, wherein a subset of the electrically-conductive solder bumps define a closed perimeter around the optical zone of the first surface, the optical zone comprising an optical cavity having sidewalls formed from a sidewall of each of the subset of the electrically-conductive solder bumps, the optical integrated circuit being surrounded by the second layer; and an electrically insulating material disposed on the optical integrated circuit, the electrically insulating material partially covering the first surface so as to expose the optical zone; and an electrical integrated circuit, wherein the second surface of the optical integrated circuit is disposed over the first major surface of the first layer, the optical zone of the first surface of the optical integrated circuit being exposed at a surface of the electro-optical system, and wherein the electrical integrated circuit overlaps with a portion of the second layer and the optical integrated circuit.

6. The electro-optical system of claim 5, wherein the optical integrated circuit comprises an electrical coupling network of the optical integrated circuit, the electrical coupling network comprising an electrically conductive formation extending through the electrically insulating material.

7. The electro-optical system of claim 6, wherein the electrical coupling network comprising electrically conductive pillars, through glass vias, or through silicon vias.

8. The electro-optical system of claim 6, further comprising a further chip embedded in the second layer, wherein the electrical coupling network of the optical integrated circuit comprises an electrically conductive formation extending through the further chip.

9. An optoelectronic device comprising:
an optical integrated circuit including a first surface, the optical integrated circuit comprising an electrically-conductive bumped structure comprising a plurality of electrically-conductive solder bumps disposed over the first surface, wherein a subset of the electrically-conductive solder bumps form a closed perimeter around an optical zone of the first surface, the optical zone comprising an optical cavity having sidewalls formed from a sidewall of each of the subset of the electrically-conductive solder bumps;

an electrical integrated circuit disposed over the first surface of the optical integrated circuit: and
an electrical coupling network of the optical integrated circuit.

10. The device of claim 9, wherein an electrically insulating material molded onto the optical integrated circuit.

11. The device of claim 9, wherein the electrically insulating material comprises a filling material with an electrically-conductive structure complementary to the plurality of electrically-conductive solder bumps and electrically coupling one or more of the plurality of electrically-conductive solder bumps with the complementary electrically-conductive structure, complementary electrically-conductive structure being coupled to the electrical integrated circuit.

12. The device of claim 9, wherein the electrical coupling network comprises traces parallel to the first surface and disposed between the optical integrated circuit and the electrical integrated circuit.

13. The device of claim 10, wherein the electrical coupling network comprises electrically conductive pillars disposed in the electrically insulating material.

14. The device of claim 9, wherein the electrical coupling network comprises through glass vias, or through silicon vias.

15. The device of claim 9, wherein the electrical coupling network comprises traces disposed over a second surface of the optical integrated circuit, the second surface being opposite the first surface.

16. The device of claim 9, wherein the electrical coupling network comprises traces disposed over the first surface of the optical integrated circuit.

17. The device of claim 1, further comprising:
an electrical integrated circuit disposed over the first surface of the optical integrated circuit; and
an electrical coupling network of the optical integrated circuit, the electrical coupling network comprising traces parallel to the first surface and disposed between the optical integrated circuit and the electrical integrated circuit.

18. The device of claim 1, further comprising:
an electrical coupling network of the optical integrated circuit, the electrical coupling network comprising traces parallel to the first surface and disposed over the second surface, the optical integrated circuit disposed between the electrical integrated circuit and the traces.

* * * * *